United States Patent

Sanftleben et al.

[11] Patent Number: 5,510,138
[45] Date of Patent: Apr. 23, 1996

[54] HOT MELT CONFORMAL COATING MATERIALS

[75] Inventors: Henry M. Sanftleben, Carmel; James M. Rosson, Kokomo, both of Ind.; Ralph D. Hermansen, Northridge, Calif.

[73] Assignees: Delco Electronics Corporation, Kokomo, Ind.; Hughes Aircraft Company, Los Angeles, Calif.

[21] Appl. No.: 248,043

[22] Filed: May 24, 1994

[51] Int. Cl.$^6$ ........................................................ B05D 5/12
[52] U.S. Cl. .......................... 427/96; 427/385.5; 427/386; 427/387; 427/398.1; 427/421; 427/422
[58] Field of Search .............................. 427/96, 386, 387, 427/385.5, 398.1, 421, 422; 437/228; 257/787–795

[56] References Cited

U.S. PATENT DOCUMENTS

| | | | |
|---|---|---|---|
| 4,572,853 | 2/1986 | Ikeya et al. | 428/76 |
| 5,302,671 | 4/1994 | Cifuentes et al. | 525/477 |
| 5,352,491 | 10/1994 | Cifuentes et al. | 427/387 |

*Primary Examiner*—Shrive Beck
*Assistant Examiner*—David M. Maiorana
*Attorney, Agent, or Firm*—Jimmy L. Funke

[57] ABSTRACT

Conformal coating materials are provided for forming a protective conformal coating on the surface of an electronic assembly. The conformal coating materials are characterized by being hot melt materials, in that they are each initially a solid or semisolid at approximately room temperature, a liquid at an elevated temperature at which the coating material is applied to the electronic assembly, and solidify upon cooling to a temperature corresponding to a service temperature of the electronic assembly. As such, the coating systems can be rapidly applied through various highly controllable techniques associated with hot melt dispensing equipment. In addition, the coating systems quickly solidify upon cooling to allow handling of the electronic assembly. The conformal coating systems may be nonreactive, indicating that the system can be remelted, or reactive, indicating that a post-application curing process occurs over time at a temperature less than the elevated application temperature.

20 Claims, 1 Drawing Sheet

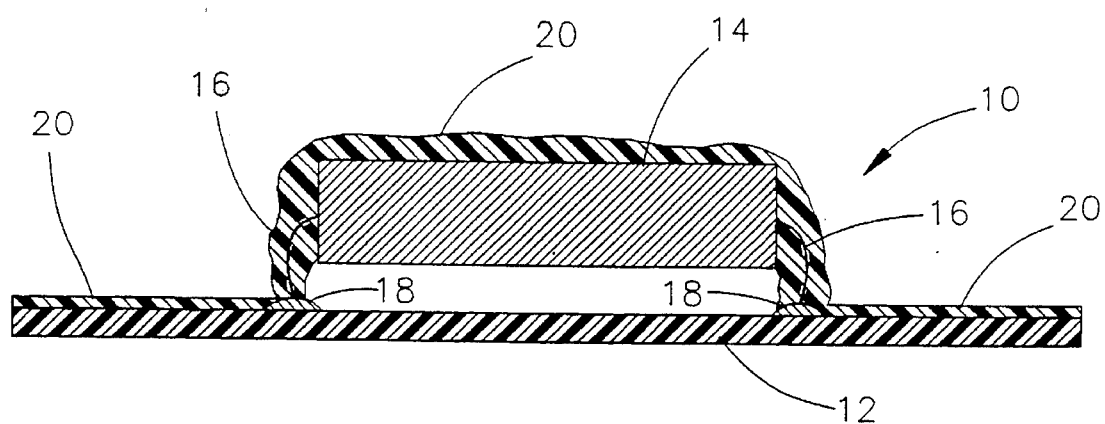

HOT MELT CONFORMAL COATING MATERIALS

The present invention generally relates to conformal coatings which are used to protect electronic circuit assemblies from moisture and dirt, as well as enable their circuit devices to be more resistant to vibration. More particularly, this invention relates to conformal coating compositions which are capable of substantially reducing processing time by being applied as a liquid at an elevated temperature, and solidifying at a temperature corresponding to a service temperature of the circuit assembly, without the use of VOC and ODC solvents.

BACKGROUND OF THE INVENTION

The demand for electronic assemblies in the automotive, aerospace and various other industries has resulted in the annual production of millions of electronic assemblies by manufacturers in the electronics industry. Often, demand has increased to the point that additional processing equipment and floor space is required to meet the growing demand. To enhance their production efficiencies, electronics manufacturers continuously seek to implement new technologies which can increase output without a corresponding increase in capital, floor space and labor.

As is also well known in the art, electronic assemblies are often required to be capable of withstanding hostile operating environments, such as those commonly found in the automotive and aerospace industries. One practice widely accepted in the electronics industry is the use of a conformal coating which forms a protective barrier layer on the circuit board. Conformal coatings are formulated to protect the electronic assembly from moisture and dirt, as well as make the circuit devices mounted to the circuit board more resistant to vibration. Generally, conformal coatings have been composed of polymeric materials of the silicone, acrylic, urethane and epoxy families. These families can be divided into groups based on their particular systems and their curing characteristics. For example, there are two-part material systems which cure upon mixing of the two components, one-part solvent-borne systems such as acrylic and hydrocarbon resins, one-part moisture cure systems, such as urethanes, epoxies and silicones, one-part frozen premixed systems, one-part heat-cured systems, ultraviolet (UV) cured systems, and vacuum deposited materials such as PARYLENE, available through the Union Carbide Corporation. Other than the vacuum deposited materials, the above coating systems are typically applied by dipping, spraying or brushing techniques, and occasionally are deposited as multiple layers. The product design, the coating process and the process capacity will generally dictate which type of coating system can be applied for a given application.

While the above materials have generally performed well, significant shortcomings exist with each. For example, two-part systems, such as CE1155 available from Conap of Olean, N.Y., typically have an extremely short pot life after mixing, and mixing problems inherently arise from time to time. Two-part systems typically require a solvent in order to reduce the viscosity of the system to a usable level. Such solvent-borne systems, such as acrylics, are often undesirable in that the solvent must be removed prior to handling, their volatile organic compounds (VOC) and/or ozone depleting compounds (ODC) may require incineration, and most solvents used pose a fire risk and/or require explosion proof equipment, all of which significantly increase manufacturing costs. Use of volatile organic compounds and ozone depleting compounds is of particular concern, in that volatile organic compounds are generally closely regulated by environmental agencies, while most ozone depleting compounds are being phased out by law. The use of water as the solvent overcomes the hazards noted above, but such systems typically have reduced electrical and physical properties. In addition, considerable costs are incurred to remove the water from the coating system.

Drawbacks are also associated with known one-part moisture cure systems. For example, urethane systems typically require seven days for full and stable electrical properties to be attained, epoxies cure slowly and will only develop thin cross-sections after cure, and silicone systems have about 5 to about 20 percent VOC from a condensation reaction which may be very fast, but the depth of cure is limited. In addition, one-part systems which are borne with solvents such as xylene and toluene, for example an acrylic system available from Start Manufacturing under the name PC101, have stringent shipping restrictions and pose health and safety concerns. Shortcomings of one-part frozen premixed systems include a short pot life at room temperature, necessitating that the system be stored frozen, though often such systems also have relatively short frozen mixed shelf lives. One-part heat cured systems have the disadvantage of requiring an extended period at an elevated temperature to cure, increasing manufacturing costs based on time, energy and inventories. UV-cured materials are generally expensive and, due to shadow cure deficiencies, typically require a secondary cure mechanism for areas on the assembly which are not be exposed to sufficient UV energy to cure the coating. Often, such areas are liquid after the UV cure, and the secondary cure, such as a moisture or heat cure, occurs slowly. Finally, vacuum deposited coating materials such as PARYLENE are extremely costly and are also costly to process.

Generally, each of the above coating systems also can be characterized as having processing disadvantages based on inventory and long processing times due to required mixing conditions and limitations, the limited methods by which these systems can be applied, and the extended period and/or equipment required to cure the coating systems. In particular, production rates of electronic assemblies are typically limited by the cure schedules of the conformal coating systems used. Consequently, manufacturing demands such as capital, floor space, labor and process inventory can be artificially high for the production of electronic assemblies which require environmental protection with a conformal coating.

In addition to the processing drawbacks noted above, conventional conformal coating systems also are capable of creating reliability problems with the electronic assembly. Specifically, the flow or placement of the coating material on the circuit board often cannot be readily controlled, In particular, the conformal coating materials often flow beneath the circuit components mounted to the circuit board, and fill at least a portion of the gap between the component and the circuit board to the extent that the gap is completely bridged. When this occurs, differences in coefficients of thermal expansion create stresses in the leads and solder joints which electrically connect and physical attach the component to the board. As a result, the expected life of the solder joints may be significantly decreased, at times on the order of up to a 75 percent loss in expected life. Factors which effect the solder joint stress include the coating thickness, its bulk modulus of elasticity, the physical characteristics of the component and its leads, the size of the gap between the component and the board, and the coefficient of thermal expansion of the component, its leads, the board, and the solder. Notably, current integrated circuit packaging trends are toward integrated circuit packages with lower standoffs and less compliant leads, therefore resulting in packages which further complicate the coating process.

From the above, it can-be seen that it would be desirable if a coating material were available which could overcome the above-noted shortcomings of conventional conformal coating systems. More specifically, such a coating material would not require the use of a solvent so as to avoid the environmental and safety hazards associated with solvents, as well as the additional costs incurred to properly address such hazards. In addition, it would be desirable if such a coating material could be applied using techniques which enable more selective application in order to avoid bridging the gap between the circuit components and the circuit board of the electronic assembly.

Accordingly, what is needed is a conformal coating system which does not require the use of solvents, can be applied in a manner which avoids bridging the gap between the circuit components and the circuit board, and avoids cure-related problems while reducing processing time and process inventory. It would also be desirable if the cost of such a coating system were relatively low in order to further minimize manufacturing costs.

SUMMARY OF THE INVENTION

It is an object of this invention to provide a conformal coating system which is capable of protecting an electronic assembly from moisture and dirt, and enables the circuit devices mounted to the circuit board to be more resistant to vibration.

It is another object of this invention that such a conformal coating system does not require the use of a solvent, so as to avoid the environmental and safety hazards associated with solvents and VOC and ODC emissions.

It is yet another object of this invention that such a conformal coating system be capable of being applied in a manner which avoids bridging the gap between the circuit board and circuit components supported on the circuit board, in particular, surface-mounted integrated circuit packages.

It is a further object of this invention that such a conformal coating system require minimal processing time and reduce manufacturing demands such as capital, floor space, labor and process inventory.

In accordance with a preferred embodiment of this invention, these and other objects and advantages are accomplished as follows.

According to the present invention, conformal coating systems are provided which are liquid at an elevated temperature at which the coating systems are applied to an electronic assembly, and solidify upon cooling to a temperature corresponding to a service temperature of the electronic assembly. As such, the coating systems are generally characterized as being hot melt compositions, can be rapidly applied through various highly controllable techniques, and will quickly solidify upon cooling to allow handling of the electronic assembly. The conformal coating systems of this invention are either nonreactive, indicating that the system can be remelted after solidifying, or reactive, indicating that a curing process occurs over time at a temperature less than the elevated application temperature. As such, the conformal coating systems of this invention may be one of several types, which include non-curing thermoplastics materials, thermosetting materials which are capable of forming a solid coating through a secondary heat or moisture-activated cure, and mixtures of curable and non-curable polymeric materials.

Generally, this invention is directed to an electronic assembly having electrical components supported on its substrate, and a hot melt composition which forms a conformal coating on at least a portion of the substrate for the purpose of environmentally protecting the substrate. The hot melt composition is characterized by being applied as a liquid at an elevated temperature, and being a solid or semisolid (e.g., having a viscosity of 500,000 centipoise (cps) or more) at about −40° C. to about 125° C. The hot melt conformal coating compositions are either fully reversible, resulting in a conformal coating which can be remelted by reheating to a sufficient elevated temperature, or reactive so as to chemically cross-link and become non-remeltable after a period of time at a reduced temperature, such as room temperature. The latter type of coating composition includes solid or semisolid two-component systems in which one of the two components is a liquid at room temperature prior to mixing.

This invention also encompasses a method for forming a conformal coating on the substrate of an electronic assembly. Such a method includes formulating the hot melt conformal coating composition to be initially a solid or semisolid at room temperature but which can be melted to form a liquid at an elevated application temperature, such as about 40° C. to about 250° C. After melting at the elevated temperature, the coating composition is deposited on at least a portion of the substrate, and then allowed to cool in order to solidify the coating composition. Upon cooling, the coating composition may undergo a chemical reaction at room temperature or during a processing or testing operation in which heat is applied, such that cross-linking occurs to render the conformal coating non-remeltable. For use as a conformal coating, the coating composition preferably has a viscosity of less than about 1000 cps at its elevated application temperature, with a viscosity of less than about 250 cps being preferable when forming thin film conformal coatings.

Using the hot melt conformal coating compositions of this invention, it is possible to greatly increase the production rate of electronic assemblies, which are generally limited by cure schedules of conventional conformal coatings. Because hot melt dispensing methods are used, hot melt equipment and systems currently used to apply adhesives in the packaging and container industries can be used to rapidly and selectively apply the coating materials to the surface of the electronic assembly, reducing process cycle time from several hours or more to a few seconds.

The coating compositions are also selected on the basis of viscosity at their elevated application temperature, so as to enable the coating compositions to be applied without flowing between the circuit components and the circuit board, which would likely reduce the service life of the electronic assembly. As hot melt materials, the coating compositions of this invention are particularly versatile in that they can be deposited by such methods as nonpattern-specific spray, extrusion, brushing, and flowing heated wave techniques. In addition, the coating compositions may exhibit limited flow characteristics, and therefore can be applied accurately and very thinly using commercially-available hot melt dispensing equipment, so as to avoid bridging the gap between the circuit board and its circuit components.

Another advantage of this invention is that such conformal coating systems do not require the use of a solvent, such that the environmental and safety hazards associated with solvents and VOC and ODC emissions are completely avoided. Consequently, considerable savings are possible in that specialized equipment is not required to handle the compositions before and after the coating process.

In addition, the use of the reactive coating compositions encompass the benefits of hot melt processing, yet include a secondary reaction for cross-linking the composition over a period of time at a reduced temperature, such as during storage, or at an elevated temperature attained during a subsequent processing or testing operation. Consequently, the advantages associated with cured coating systems, such as stability and resistance to chemical attack, could be realized while retaining the advantages of hot melt application methods. Furthermore, the conformal coating-system of this invention has the potential for being relatively inexpensive as compared to conventional conformal coating systems.

Other objects and advantages of this invention will be better appreciated from the following detailed description.

BRIEF DESCRIPTION OF THE DRAWINGS

The above and other advantages of this invention will become more apparent from the following description taken in conjunction with the accompanying FIGURE, which shows a cross-sectional view of an electronic assembly on which has been deposited a hot melt conformal coating material in accordance with this invention.

DETAILED DESCRIPTION OF THE INVENTION

The present invention provides materials for forming a protective conformal coating on the surface of an electronic assembly. The conformal coating materials of this invention can all be characterized as hot melt materials, in that each is initially a solid at roughly room temperature, melts to become a liquid at an elevated temperature at which the coating material is applied to the electronic assembly, and forms a solid upon cooling to a temperature corresponding to a service temperature of the electronic assembly. As such, the coating systems can be rapidly applied through Various highly controllable techniques, and will quickly and sufficiently solidify upon cooling to allow handling of the electronic assembly.

Referring to the FIGURE, an electronic assembly 10 is represented which illustrates some of the general concepts of this invention. As shown, the electronic assembly 10 includes a circuit board 12 on which is supported a circuit component 14, such as an integrated circuit chip. As is conventional, the component 14 is electrically connected to the circuitry of the electronic assembly 10 and secured to the circuit board 12 with a number of leads 16 that are joined with solder 18 to conductors (not shown) present on the circuit board 12. As is conventional, the leads 16 support the component 14 above the surface of the circuit board 12 such that a gap is created therebetween. A conformal coating 20 is deposited on the circuit board 12 in accordance with this invention, such that the gap between the component 14 and the circuit board 12 is not filled or bridged, a condition which would reduce the service life capability of the electronic assembly 10. As shown, the conformal coating 20 is deposited on the exposed portion of the circuit board 12 as well as the circuit component 14, though a smaller surface area of the electronic assembly 10 could be covered by the conformal coating 20. Generally, the conformal coating 20 is shown as being a thin film, generally on the order of about 0.05 to about 0.13 millimeters (about 0.002 to about 0.005 inch) in thickness, though it is foreseeable that greater or lesser thicknesses could be used.

The above-described electronic assembly 10 is merely intended to represent generally conventional circuit assemblies. Therefore, the teachings of this invention are not limited to the specific configuration shown in the Figure, and are equally applicable to electronic assemblies which utilize a ceramic substrate or a printed wiring board such as a polyimide, mylar, epoxy-glass or phenolic laminate, essentially any type and combination of circuit components, and various techniques for securing and electrically connecting the components to the assembly, particularly those associated with surface mount technology (SMT) integrated circuit packages. Accordingly, those skilled in the art will recognize that numerous variations of the illustrated electronic assembly 10 are possible, all of which are within the scope of this invention.

As noted above, a key feature of this invention is that the conformal coating 20 is a hot melt composition, meaning that it is initially a solid or semisolid at approximately room temperature, a liquid at an elevated temperature at which the coating material is applied to the electronic assembly 10, and solidifies upon cooling to a temperature corresponding to a service temperature of the electronic assembly 10. Therefore, a significant advantage of this invention is that the coating materials of this invention can be rapidly applied using hot melt equipment, and will solidify upon cooling without requiring an extended cure at an elevated temperature, removal of a solvent, or any of the other conventional curing practices noted previously. In addition, the hot melt coating materials of this invention eliminate bridging between the lower surface of the circuit component 14 and the circuit board 12, in that such materials have limited flow characteristics and can be applied accurately and very thinly using hot melt dispensing equipment currently available.

The specific characteristics desired of the conformal coating materials of this invention include the following. First, each coating material should initially be a solid or semisolid in order to allow loading into hot melt dispensing equipment. Secondly, the coating materials must liquify and reach a viscosity of less than about 1000 cps when at a dispensing temperature in the range of about 40° C. to about 250° C., though it is foreseeable that viscosities in excess of about 10,000 cps may be acceptable, depending on the application method, the desired thickness of the coating, and the surface area to be covered. Most preferably, the coating materials should have a work life of about three hours or more at the elevated dispensing temperature. Thirdly, the conformal coating formed by the coating material should not be rigid or brittle within the intended service temperature range for the electronic assembly 10. Fourthly, the coating material should be suitable for its intended application environment, which generally necessitates some degree of resistance to chemical attack and elevated temperatures.

In general, the hot melt conformal coating materials which have been determined to satisfy the above criteria are nonreactive, indicating that the system can be subsequently remelted, or reactive, which designates that a curing process occurs over time at a temperature less than the elevated dispensing temperature, and preferably at room temperature to allow curing during storage. The former type of conformal coating materials is non-curing thermoplastic materials, while the latter type is a curable thermosetting material or a mixture of curable and non-curable materials that are capable of forming a solid coating through a secondary cure.

Examples of non-curing (and therefore nonreactive) thermoplastic materials suitable for use as the hot melt conformal coating 20 of this invention include wax, rosin, thermoplastic rubber materials, rubber materials, noncatylized and nonreactive silicone resins, noncatylized phenolic resins, acrylic resins, polyolefins such as polyethylene and polyproplylene, and TEFLON (polytetrafluoroethylene). Each of these hot melt conformal coating materials is characterized as being a solid or semisolid within the range of about –40° C. to about 125° C., and being a liquid at a temperature of about 200° C. or greater, and are therefore distinguishable from conventional conformal coating materials. As such, these materials are suited for use as hot melt materials, and can be selectively applied to the circuit board 12 with hot melt dispensing equipment as a liquid at an elevated temperature. Upon cooling to room temperature, these materials solidify and form a protective conformal coating 20 over the surface of the circuit board 12. Anticipated service temperatures will influence which of the above non-curing thermoplastic materials is best suited for a given application, with some applications foreseeably entailing temperatures less extreme than the –40° to 125° C. range noted above. Polyolefins, noncatylized or nonreactive silicone resins and waxes are believed to be particularly suitable for use as the nonreactive conformal coating materials of this invention.

The above nonreactive hot melt materials are suitable for many applications in which relatively low service temperatures (e.g., about 125° C. or less) are anticipated. In addition, these nonreactive hot melt materials can be applied very rapidly, which is advantageous for high volume manufacturing. However, nonreactive materials have a somewhat limited useful temperature range and limited solvent resistance. Consequently, hot melt materials which undergo a curing process via cross-linking, and therefore will not remelt or soften at higher temperatures, are generally preferable for applications demanding a higher operating temperature range and/or improved solvent resistance. The curing mechanism which accomplishes the cross-linking ideally takes place at moderate elevated temperatures attained during a subsequent processing or testing operation, or at room temperature. The tendency for cross-linking at elevated temperatures would seriously curtail the work life of the hot melt or require lengthy cures at elevated temperatures, which are both shortcomings of prior art conformal coatings. Examples of the latter are one-component, room temperature stable epoxies which are typically cured by aromatic diamines or dicyandiamide over several hours at a temperature of between about 150° C. and 200° C. Similarly, urethanes based on blocked isocyanates require hours at similar temperatures in order to cure. Consequently, such materials are distinguishable from the hot melt materials of the present invention.

In accordance with this invention, preferred reactive hot melt conformal coating materials include coating systems which are capable of: a secondary moisture cure, such as certain silicone and urethane (amide) -base chemistries; a multistage melting-activated cure using a reactive cross-linking agent, such as by formulating a multicomponent chemistry in which a reactive cross-linking agent is blended into a higher temperature melting material, such as a silicone, urethane, epoxy and acrylic, which is melted within the last zone (e.g., the dispensing head) of the hot melt system; a secondary UV cure; a heat-activated cure, such as is possible with an epoxy-base material composed of bisphenol A, novolac, and phenolic resins admixed with a curative, such as amine; or a mixture of a nonreactive polymeric material with a curable polymeric material, for example, epoxy, urethane, urea or silicone-base materials which are blended with a thermoplastic material, an engineering resin, or a hybrid mixture.

Moisture curing is a preferred method of cross-linking for the present invention, because moisture curing can occur at room temperature. Thus, energy otherwise expended for heat cures is saved, as well as capital expenditures for ovens and other equipment. Silicones, epoxies and urethanes can all moisture-cure if specifically formulated for that purpose. For example, epoxies can moisture-cure via a kerimine reaction, in which moisture causes the kerimine to dissociate into polyamine and ketone. The ketone evaporates from the material and the polyamine reacts with the epoxy resin to form a network polymer. Another example is urethane which moisture-cures via an isocyanate moisture reaction, in which moisture causes the isocyanate to dissociate into a primary amine and carbon dioxide. The carbon dioxide leaves the material as a gas, while the primary amine rapidly reacts with free isocyanate to form a urea linkage. In addition, polyfunctional isocyanates moisture-cure to form network polymers. Isocyanate-terminated prepolymers are usually used for moisture cures.

The suitability of certain nonreactive and reactive coating materials outlined above was investigated through evaluations of different combinations of ingredients, with emphasis on processing, flexibility and stability characteristics of the resulting coating materials. The processing characteristics included viscosity and adhesion of the hot melt at elevated temperatures, while flexibility was determined by durometer testing and hand flexing.

Testing of the nonreactive class of coating materials focused on amorphous polyolefins which had been modified with polybutene for purposes of lowering their glass transition temperatures ($T_g$). Polyolefins were selected on the basis of high process throughput capability, low glass transition temperature, mechanical properties which are comparable to elastomeric dimethyl silicone at temperatures of between about –40° C. and 105° C., equivalent electrical properties to silicone between about –40° C. and 150° C., low raw material costs, and their compatibility with various application methods used in the hot melt industry. Polyolefins also have the advantage of being very stable when melted, enabling them to be kept in a molten state at a suitable dispensing temperature (e.g., 160° C. to 230° C.) for extended periods of time. In contrast, thermoplastics such as polyamides tend to char at temperatures of about 5° C. to about 10° C. above their melting temperatures, which would severely limit their ability to achieve a usable viscosity for dispensing with hot melt equipment. While polyolefins are discussed below, generally any of the above-noted nonreactive polymer system which can attain a viscosity of less than about 1000 cps can be utilized to form a suitable conformal coating using hot melt techniques. A viscosity of less than 250 cps at the desired dispensing temperature is preferable. For purposes of this invention, materials having viscosities of less than 1000 cps at relatively low dispensing temperatures are preferable in that a hot melt material will tend to flow and self-level better with less preheating of the circuit board, and a longer open time is possible, which further promotes the ability of the hot melt to sufficiently flow and self-level.

The hot melt polyolefin formulations indicated in Table I were evaluated for purposes of this invention. The polyolefin was an amorphous polyolefin (APO), which generically includes propylene homopolymers, propylene-ethylene copolymers, propylene-butene copolymers, propylene-hexene copolymers, propylene-butene-ethylene terpolymers, ethylene homopolymers, and blends containing one or more of the above polymers. The particular amorphous polyolefin used was E1010, available from the Eastman Kodak Company, having a $T_g$ of about −24° C. and a ring and ball softening point of about 140° C. per ASTM E-28-67.. E 1010 is a propylene-ethylene copolymer identified under the trademark EASTOFLEX by Eastman Kodak. Another suitable Eastman Kodak EASTOFLEX material is a propylene homopolymer identified as P1023, having a $T_g$ of about −10° C. and a ring and ball softening point of about 155° C. Generally, selection of the polybutene was based on minimal volatility, preferably on the order of less than about 2 weight percent loss at 100° C. The polybutene used was H-300 from the Amoco Chemical Corporation, though other suitable grades available from Amoco Chemical include H-100, H-1500, H-1900, with increasing grade numbers indicating an increase in viscosity. H-300 was selected in part due to its volatility at about 98° C. of less than 0.1 percent over ten hours. The paraffin was a paraffinic fully-refined wax available from Union Oil as ARISTO WAX 165, which has a melting point of about 70° C. The epolene wax was obtained from Eastman Kodak under the name N-15, having 15 carbons in its backbone, a molecular weight of about 11,000 and a ring and ball softening point of about 163° C. The paraffin/wax additions were utilized to control tackiness of the formulations at room temperature. ARISTO WAX 165 advantageously has a high melting point and will not contribute an odor, while the epolene wax is able to raise the melting temperature while also lowering the viscosity of the formulations. Notably, other additives could be used, including polyamide resins, ethylene-vinyl acetate copolymers, terpene resins, polyvinyl acetates, polyisobutylene, hydrocarbon-based resins, wood rosin ester, natural or synthetic rubbers, or other modifiers known to those skilled in the art.

TABLE I

| | (in Parts) | | | |
|---|---|---|---|---|
| | Polyolefin | Polybutene | Paraffine | Epolene wax |
| A | 100.00 | 19.23 | 19.62 | 0.00 |
| B | 100.00 | 42.03 | 20.29 | 0.00 |
| C | 100.00 | 21.43 | 21.19 | 25.00 |
| D | 100.00 | 39.02 | 22.93 | 19.51 |
| E | 100.00 | 19.10 | 0.00 | 20.22 |
| F | 100.00 | 40.54 | 0.00 | 20.27 |
| G | 100.00 | 20.73 | 13.41 | 20.73 |
| H | 100.00 | 40.48 | 20.24 | 10.71 |
| I | 100.00 | 30.12 | 10.24 | 12.05 |
| J | 100.00 | 19.05 | 9.62 | 9.52 |

The above formulations were evaluated for their glass transition temperature ($T_g$) per ASTM D3418, Shore A hardness per ASTM D2240 with a five second dwell, and weight loss. All were solid at room temperature. Generally, a greater presence of polybutene corresponded to a lower glass transition temperature and viscosity, but also diminished the allowable open time of the formulation. All of the samples had a melting temperature of about 160° to 165° C., with the exception of Samples A and B, which had melting temperatures of 125° and 115° C., respectively. At 145° C., Samples A and B were liquid, Samples C, D, H, I and J were either semisolid or tacky, and Samples E, F and G generally were not tacky. The glass transition temperatures of the formulations were generally between about −34° and −45° C.

Samples D, E, F, I and J were selected for further testing, which included hardness and weight loss as a result of heat aging. Hardness was measured as durometer Shore A after about 70 hours at about 150° C. per ASTM D2240 (using a five second dwell), while weight loss was determined after about 70 hours at about 150° C. The results were as follows.

TABLE II

| | Hardness | Change in | % Weight Loss | |
|---|---|---|---|---|
| | Shore A | Shore A | Average | Std. Dev. |
| D | 20 | −3 | −4.84 | 0.36 |
| E | 35 | +5 | −1.55 | 0.35 |
| F | 20 | 0 | −3.38 | 0.49 |
| I | 15 | −5 | −3.25 | 0.49 |
| J | 20 | 0 | −2.26 | 0.45 |

An additional formulation was prepared for evaluating with hot melt dispensing equipment in order to determine its hot melt process parameters. The formulation was essentially the same as Sample A of Table I, composed of about 100 parts E1010 polyolefin, about 20 parts H-300 polybutene, and about 20 parts Aristo Wax 165 paraffin. The equipment used was a handheld cartridge applicator available from PAM Fastening Technology, Inc. Generally, the formulation had a maximum allowable open time of less than about one minute at a working temperature of about 170° C. Minimal stringing occurred between the applicator and the circuit board being coated during application, suggesting that the formulation could be dispensed with a brush applicator. The resulting conformal coating had a thickness of about 0.025 to about 0.25 millimeter, which encompasses the desired 0.05 to 0.13 millimeter range for a conformal coating. Generally, there was minimal surface tack, indicating that the coated circuit board could be handling practically immediately after cooling.

A further evaluation was conducted with Sample J of Table I to determine the application characteristics using a commercial hot melt dispensing system. The dispensing system was Model 022, manufactured by ITW Dyantec of Hendersonville, Tenn. System settings for the evaluation were as follows: Melt tank temperature—about 190° C.; Hose temperature—about 222° C.; Dispensing head temperature—about 225° C.; Air pressure (for air preheater)—about 30 psi; Atomized spray; nozzle size —0.030 inch fan cap configuration; and pump motor speed —18 percent of maximum. Various application methods were tested. Application by swirl spray resulted in an excessive coating thickness of about 0.13 to about 0.38 millimeter. Application by atomized spray without preheating the air or substrate produced an uneven coating, while preheating the air produced a more even and usable coating, though having a thickness of about 0.13 to about 0.25 millimeter. Preheating the substrate with hot air to achieve a substrate temperature of about 50° C. to about 100° C., resulted in a uniform coating having a desired thickness of about 0.05 to about 0.13 millimeter. Similar results are achievable with both swirl air flow and fan spray methods in lieu of the atomized spray method used.

From the above evaluations, it was concluded that nonreactive compositions containing about 100 parts APO, up to about 40 parts polybutene, up to about 20 parts paraffine, and up to about 20 parts epolene wax are able to yield a suitable hot melt conformal coating. As noted previously, it is believed that suitable nonreactive compositions can also be achieved with additions of polyamide resins, ethylenevinyl acetate copolymers, terpene resins, polyvinyl acetates, polyisobutylene, hydrocarbon-based resins, wood rosin ester, natural or synthetic rubbers, or other modifiers known to those skilled in the art.

The reactive class of conformal coating materials evaluated for purposes of this invention primarily involved epoxy-base systems, in which a suitable coating material was achieved by (1) mixtures of epoxy resins, at least one of which is solid or semi-solid, or o(3) curing using a two-part system, or through a secondary chemical reaction activated by heat or moisture, or (3) a combination of the above. Various methods exist by which curing can be achieved in the practice of this invention. For example, an epoxy-base material composed of bisphenol A, novolac and phenolic resins, which are all semisolid or solid at room temperature, yields a high equivalent weight epoxy resin which requires a curative at the rate of only about 1 to about 10 parts per hundred parts (phr) of the epoxy-base material. Accordingly, methods by which curing can be achieved in accordance with this invention are categorized as follows: (1) the use of latent curatives such as solid amine, amine aduct, polyamide or carboxylic acid which melt at a higher temperature than the epoxy resins, or heat-activated curatives such as AJI-CURE PN-23, available from Ajinomoto USA, Inc.; (2) blending an epoxy curative (for example, a diethylene glycol diaminopropyl ether such as ANCAMINE (R) 1922 available from Pacific Anchor) into a high melting point thermoplastic resin, such as a wax, rosin, acrylic resin, polyethylene, ABS blends, amide waxes, and polyethylene glycols and methoxypolyethylene glycols (such as CASTORWAX, available from CasChem or an epolene wax, such as N-14 or N-15 from Eastman Kodak), as well as others; (3) using a moisture curing agent such as kerimine or low NCO isocyanates; (4) using a two-part reactive system; and (5) a combination of the above.

In the evaluation of mixtures of epoxy resins, liquid flexible resins were used to determine their ability to flexibilize solid epoxy resins, so as to yield a conformal coating formulation which does not require the presence of a curative. Such an approach was adopted in that most solid epoxy resins are extremely brittle, and therefore cannot be use alone as a conformal coating. Additional benefits to blending liquid flexible resins with solid epoxy resins include lower application temperatures as a result of a liquid flexible resin having a lower viscosity at a given temperature, better flow characteristics as a result of a lower viscosity, enabling the use of less preheating of a substrate to obtain a uniform thin conformal coating, modifiable flow properties by altering the amount of solid epoxy resin and liquid flexible resin, and a general facilitation of processing.

The selection of the liquid flexible epoxy resins was based on three factors: (1) a sufficiently high viscosity to preserve solid phase characteristics of the solid resin, (2) hydrolyric stability, and (3) the ability to impart flexibility to the solid resin. The solid epoxy resins evaluated were a bisphenol-A type resin available from Dow Chemical Company under the name DER 661, a bisphenol-A type resin available from Shell Chemical under the name Epon 1004F, and a novolac type resin available from Shell Chemical under the name Epi-Rez SU8. The liquid flexible resins were a polyglycidyl ether of poly-(oxypropylene) polyol available from Shell Chemical under the name Heloxy 84, and a diglycidyl ether of poly-(oxypropylene) available from Dow Chemical under the name DER 732. The more suitable formulations resulting from this investigation are indicated in Table III.

TABLE III

|   | Solid | wt % | Flexible | wt % | Compat. | State |
|---|-------|------|----------|------|---------|-------|
| A | DER 661 | 80 | DER 732 | 20 | good | 3.8 |
| B | " | 70 | " | 30 | good | 2.8 |
| C | " | 60 | " | 40 | good | 2.0 |
| D | " | 80 | Heloxy 84 | 20 | good | 4.1 |
| E | " | 70 | " | 30 | good | 3.4 |
| F | " | 60 | " | 40 | good | 2.9 |
| G | 1004F | 80 | DER 732 | 20 | good | 4.5 |
| H | " | 70 | " | 30 | good | 3.5 |
| I | " | 60 | " | 40 | good | 3.0 |
| J | " | 80 | Heloxy 84 | 20 | good | 4.8 |
| K | " | 70 | " | 30 | good | 4.0 |
| L | " | 60 | " | 40 | good | 3.0 |
| M | SU8 | 80 | DER 732 | 20 | good | 4.0 |
| N | " | 70 | " | 30 | good | 3.2 |
| O | " | 60 | " | 40 | good | 2.8 |
| O | " | 50 | " | 50 | good | 2.0 |

Rating Definitions:
Compatibility:
good = Produces clear solution when mixed with no separation or phasing of the components over time.
Physical State:
1 = A flowable liquid with a melting point well below room temperature; Viscosity on the order of about 50,000 cps or less.
2 = A slow-flowing liquid, melting point is slightly below room temperature; Viscosity on the order of about 50,000 to 500,000 cps.
3 = A semisolid material; Tacky and easily deformed at room temperature, but will self-level over hours or days; Melting point is slightly at or near room temperature; Viscosity on the order of about 500,000 to 5,000,000 cps.
4 = A plastic solid; Has little or no tack at ambient, but can be deformed with some effort; Melting point is above room temperature; Viscosity above about 5,000,000 cps.
5 = A rigid solid; Brittle and may be fractured at room temperature, Melting point is well above room temperature.

From the evaluations represented above, it was determined that Heloxy 84 was incompatible to varying degrees with the solid epoxy resins as evidenced by exudation, while DER 732 was found to be more compatible. The solid epoxy resins exhibited a higher tolerance of liquid flexible resins while retaining a solid state in the following order: Epi-Rez SU8, Epon 1004F and DER 661. It was concluded from the above trials that the solid epoxy resins should be selected with as high a melting temperature as possible so that the addition of the liquid flexible resin would not liquify the entire mixture at room temperature. In addition, from the standpoint of surface tack, state ratings of about 3.4 or more were considered to be suitable, reflecting a lower level of surface tack which otherwise has an adverse effect the ability to handle a substrate after coating. Generally, it is believed that the addition of a phenolic resin to the above formulations would reduce tackiness, in that they act as accelerators for many epoxy curatives.

Overall, the above formulations indicated that a reactive hot melt epoxy conformal coating can be flexibilized by mixing with liquid flexible resins. Accordingly, with the addition of a suitable curative, it was concluded that these formulations could yield a cured, relatively flexible conformal coating, with the recognition that the curable reactive resin component of each formulation would dominate the noncurable liquid flexible resin component of each formulation. Notably, the addition of liquid flexible resins was also beneficial in lowering the melting temperature of the solid epoxy resins. Furthermore, the addition of liquid flexible resins can be expected to accelerate moisture curing by increased molecular motion and higher moisture permeability. The most preferred combinations identified from this evaluation were Samples D, G, J, K and M, in that any tack exhibited by these systems disappeared during curing so as to form a plastic, slightly deformable solid having little or no tack at ambient temperatures and a melting point above room temperature.

Evaluations were then performed with epoxies formulated to contain a kerimine curative to effect a moisture cure. As is known in the art, kerimines react with epoxy resins at a practical rate of cure under ambient conditions, in which atmospheric moisture is absorbed during and after application to serve as a source of water required to activate the curing agent and thereby form a polyamine and ketone. The kerimine curatives used were several available from the Shell Chemical Company, identified as H-1, H-2 and H-3. Moisture-curable urethanes were also formulated with unreacted isocyanate groups. Accordingly, isocyanateterminated prepolymers of polymeric diols and triols were favored, especially those having a low % NCO content which will react with moisture to form an amine, which then will react with an epoxy or isocyanate. Generally, the above polymer systems are liquids at room temperature prior to curing. Therefore, these polymer systems must be solidified to some degree in order to be appropriately loaded into conventional hot melt equipment.

Reactive hot melt epoxy compositions were formulated using the H-1 and H-3 kerimine moisture curing agents noted previously. Moisture-curing techniques were pursued in that their use is highly energy efficient, and eliminates the requirement for curing ovens or the like to effect post cures. The various epoxy resins tested included DER 661, DER 732, Epi-Rez SU8 and Heloxy 84, as described above, in addition to bisphenol-A type resins available from Dow Chemical under the names Epon 164, Epon 828, Epon 1001, and Epon 2002, novolac type resins DEN 431, DEN 438 and DEN 444 available from Dow Chemical, NC-547 available from Cardolite, and other solid multifunctional resins such as HPT 1071 available from Shell Chemical and MT-0163 available from the Ciba-Geigy Corporation. Heloxy 67 and Heloxy 505, both available from Shell Chemical, and NC-514, available from Cardolite, were included as diluents and modifiers.

Results of the epoxy-base hot melt conformal coating formulations are indicated in Tables IV and V. Moisture cure characteristics and resistance to acetone as an indication of network polymer formation are noted for the formulations of Table IV.

TABLE IV

| Resin | RT State | phr H-1 | Cure Time | Comment |
|---|---|---|---|---|
| Epon 828 | liquid | 27.4 | ≈7 days | Insoluble solid |
| DER 661 | solid | 9.9 | >14 days | Soluble solid |
| NC-514 | liquid | 14.9 | 4–7 days | Swellable rubber |
| NC-547 | liquid | 8.7 | 2–4 days | Swellable rubber |
| DEN 438 | semisolid | 29.2 | 7–10 days | Insoluble solid |
| SU8 | solid | 25.7 | N/A | Unable to mix |
| HPT 1071 | solid | 32.5 | 7–14 days | Insoluble solid |
| MT 0163 | solid | 27.1 | 7–14 days | Insoluble solid |
| Heloxy 67 | liquid | 40.0 | 2–3 days | Swellable rubber |
| DER 732 | liquid | 16.3 | 2–3 days | Swellable rubber |
| Heloxy 84 | liquid | 8.0 | 7–10 days | Swellable rubber |
| Heloxy 505 | liquid | 8.7 | 2–3 days | Swellable rubber |

TABLE V

| Resin | RT State | phr H-3 | Comment |
|---|---|---|---|
| DEN 431 | liquid | 57.71 | Partially cured in 4 hours |
| DEN 444 | semisolid | 48.10 | No tack at room temperature |
| NC-547 | liquid | 16.83 | Partially cured in 4 hours |
| Epon 164 | semisolid | 45.91 | No tack at room temperature |
| Epon 1001 | solid | 18.70 | Little cure after 24 hours |
| Epon 2002 | solid | 14.03 | Little cure after 24 hours |

Generally, the DEN 431, DEN 444 and NC-547 novolacs cured much faster with the H-3 kerimine curative than did the Epon 164, Epon 1001 and Epon 2002 bisphenol-A type resins. The Epon 1001 and 2002 epoxies exhibited little or no curing after 24 hours at room temperature, while the remaining formulations exhibited a cured and irreversible condition. From this investigation, it was concluded that increased flexibility assists the moisture curing process, in that formulations which are not brittle tended to moisture cure more readily.

The formulations of Tables IV and V were deemed to be base reactive conformal coatings. For example, foreseeable refinements to the formulations of Table V would be to reduce tackiness through the inclusion of a phenolic resin, or to enhance flexibility with a flexibilized epoxy resin. Upon further investigation, a modified formulation found to have particularly desirable adhesion and processing properties was composed of about 5.5 parts DEN 431, about 40 parts NC-547, about 10.5 parts Epon 1001, about 40 parts DEN 444, and about 33.15 parts H-3 as a hardener. The resulting conformal coating exhibited suitable physical properties by being a very flexible solid to semi-solid system which was capable of curing to a depth of about six millimeters within about one week.

On the basis of the above results and with the knowledge that phenolic resins are compatible with novolac resins, approximately 50/50 mixtures of phenolic resin and DEN 431 were prepared, with the resulting formulations yielding a slow-curing composition with no surface tack. In addition, the phenolic resin also served to modify the flow properties of the novolac resin, producing a more viscous mixture prior to curing.

Formulations of reactive hot melt urethane formulations were then tested. The base material for these urethanes is the isocyanate-terminated prepolymer (ITP), which is capable of moisture-curing with no other ingredient present. However, most of these ITPs are liquid at room temperature, which is incompatible with hot melt processes. Accordingly, one approach was to mix ethylene vinyl acetate (EVA), which is a solid at room temperature, into the formulations to yield a room temperature solid. A second approach was to synthesize an ITP which solidified at room temperature, using two moles of DDI-1410, a diisocyanate available from Dow Chemical, and one mole of dried 1,4-butane diol. Mixing these constituents at room temperature started a reaction which heated the mass to about 70° C. The ITP formed was a wax-like solid upon cooling, with a melting temperature of about 50° C. to about 75° C. and calculated free NCO of about six percent.

Two formulations were than prepared, Sample A using the synthesized DDI-1410 prepolymer, and Sample B using about 50 parts of the DDI-1410 prepolymer and about 50 parts EVA mixed at about 125° C. Sample A was generally a waxy solid having a melting temperature of about 50° C. to about 75° C. and, after curing, was tough and flexible. Sample B was also generally a waxy solid having a melting temperature of about 100° C. which, even after curing, remained a waxy solid. Generally, the above urethane reactive hot melt compositions exhibited much faster moisture-cures than the reactive epoxy compositions, possible due to the higher reactivity of the isocyanate/amine reaction as compared to the epoxy/amine reaction.

From the above, those skilled in the art will appreciate that the present invention demonstrates the ability to formulate conformal coating systems which are initially a solid or semisolid at room temperature, are a liquid at an elevated temperature at which the coating systems can be applied to an electronic assembly, and which solidify upon cooling to a service temperature of the electronic assembly to form a conformal coating. As such, the conformal coating systems of this invention can be characterized as hot melt compositions, can be rapidly applied using commercially-available hot melt dispensing equipment, and then quickly solidified by cooling to room temperature or through curing during a subsequent processing or testing operation. Accordingly, significant advantages of the conformal coating systems of this invention include their ability to be selectively and accurately deposited on an electronic assembly's substrate or circuit board, and their ability to allow the electronic assembly be handled soon after deposition.

The specific advantages of the conformal coating systems of this invention are determined by their status as being nonreactive or nonreactive. Nonreactive hot melt conformal coatings of this invention are characterized by their ability to be remelted, and include non-curing thermoplastic materials such as wax, rosin, thermoplastic rubber materials, rubber materials, noncatylized and nonreactive silicone resins, noncatylized phenolic resins, acrylic resins, polyolefins such as polyethylene and polypropylene, and TEFLON (polytetrafluoroethylene) each of which is a solid or semisolid within the range of about −40° C. to about 125° C., and a liquid at a temperature of about 200° C. or greater. In contrast, the reactive hot melt conformal coatings of this invention are characterized by their ability to cure over time at a temperature less than the elevated application temperature, and may be mixtures of curable and non-curable thermoplastic and/or thermosetting materials which are capable of forming a solid coating through a secondary heat or moisture-activated cure.

In use, this invention also encompasses a method for forming a conformal coating on the substrate or circuit board of an electronic assembly. Generally, the conformal coating method made possible by this invention entails formulating the hot melt conformal coating composition to be a solid at room temperature to allow its use with commercially-available hot melt dispensing equipment. Consequently, the hot melt conformal coating composition must also be capable of being a liquid at an elevated temperature of about 40° C. to 60° C. or greater, corresponding to temperatures at which the composition is dispensed and deposited on the electronic assembly using hot melt equipment. Such equipment allow the coating compositions of this invention to be deposited using such methods as nonpattern-specific spray, extrusion (with or without the extrusion application head contacting the circuit board), brushing, and flowing heated wave techniques, all of which are application techniques known to those skilled in the art. The deposited coating composition is then allowed to cool so as to solidify and form the desired conformal coating, for the purpose of providing environmental protection to the electronic assembly. In accordance with this invention, the conformal coating may be fully reversible upon cooling so as to enable remelting of the conformal coating by reheating to the elevated temperature, or the conformal coating may be reactive so as to chemically cross-link and become non-remeltable after a period of time at room temperature.

Using the hot melt conformal coating compositions of this invention, it is possible to greatly increase the production rate of electronic assemblies, which are generally limited by cure schedules of conventional conformal coatings. Because hot melt materials are dispensed using hot melt equipment and systems currently used to apply adhesives in the packaging and container industries, the desired conformal coatings can be formed rapidly and selectively on the surface of an electronic assembly, reducing process cycle time to a few seconds. The coating compositions are also capable of being formulated such that their viscosity at the elevated dispensing temperature enables the coating compositions to be applied without flowing beneath the circuit components mounted to the circuit board, a result which is known to reduce the service life of an electronic assembly.

Another advantage of this invention is that such conformal coating systems do not require the use of a solvent, such that the environmental and safety hazards associated with solvents and VOC and ODC emissions are completely avoided. Consequently, considerable savings are possible in that specialized equipment is not required to handle the compositions before and after the coating process. In addition, use of the reactive coating compositions of this invention simultaneously encompass the benefits of hot melt processing and the advantages of a thermoset conformal coating. Consequently, the advantages associated with cured coating systems, such as stability and resistance to chemical attack, are realized while retaining the advantages of hot melt deposition methods. Finally, the conformal coating systems of this invention have the potential for being relatively inexpensive.

While our invention has been described in terms of a preferred embodiment, it is apparent that other forms could be adopted by one skilled in the art; for example, by substituting appropriate materials which achieve the desired characteristics of the nonreactive and reactive hot melt conformal coating compositions of this invention. Accordingly, the scope of our invention is to be limited only by the following claims.

We claim:

1. A method for forming a conformal coating on at least a portion of a substrate of an electronic assembly, said method comprising the steps of:

formulating a hot melt conformal coating composition which is initially a solid or semisolid at approximately room temperature and a liquid at an elevated temperature which is higher than room temperature;

depositing said hot melt conformal coating composition on said portion of said substrate while said hot melt conformal coating composition is at said elevated temperature; and allowing said hot melt conformal coating composition to cool on said portion of said substrate and solidify so as to form a conformal coating which provides environmental protection to said portion of said substrate.

2. A method as recited in claim 1 wherein said formulating step comprises formulating said hot melt conformal coating composition to be fully reversible so as to enable remelting of said conformal coating upon reheating to said elevated temperature.

3. A method as recited in claim 1 wherein said formulating step comprises formulating said hot melt conformal coating composition to be reactive so as to chemically cross-link and become non-remeltable after a period of time at room temperature.

4. A method as recited in claim 1 wherein said formulating step comprises formulating said hot melt conformal coating composition to be reactive so as to chemically cross-link and become non-remeltable from exposure to said elevated temperature during subsequent processing of said electronic assembly.

5. A method as recited in claim 1 wherein said formulating step comprises formulating said hot melt conformal coating composition to comprise two components which react, such that said hot melt conformal coating composition becomes non-remeltable after a period of time at room temperature.

6. A method as recited in claim 5 wherein one of said two components comprises a liquid component at room temperature.

7. A method as recited in claim 1 wherein said hot melt conformal coating composition has a viscosity of less than about 1000 cps at said elevated temperature.

8. A method as recited in claim 1 wherein said hot melt conformal coating composition is moisture-curable so as to chemically cross-link and become non-remeltable after a period of time at room temperature.

9. A method for forming a conformal coating on at least a portion of a substrate of an electronic assembly, said method comprising the steps of:

formulating a hot melt conformal coating composition which is initially a solid or semisolid at approximately room temperature, a liquid at an elevated temperature which is higher than room temperature and reactive so as to chemically cross-link and depositing said hot melt conformal coating composition on said portion of said substrate while said hot melt conformal coating composition is at said elevated temperature; and allowing said hot melt conformal coating composition to cool on said portion of said substrate and chemically cross-link so as to solidify after said period of time, and thereby form a conformal coating which provides environmental protection to said portion of said substrate.

10. A method as recited in claim 9 wherein said formulating step comprises formulating said hot melt conformal coating composition to be reactive so as to chemically cross-link and become non-remeltable after said period of time at room temperature.

11. A method as recited in claim 9 wherein said formulating step comprises formulating said hot melt conformal coating composition to be reactive so as to chemically cross-link and become non-remeltable from exposure to said elevated temperature during subsequent processing of said electronic assembly.

12. A method as recited in claim 9 wherein said formulating step comprises formulating said hot melt conformal coating composition to comprise two components which react, such that said hot melt conformal coating composition is non-remeltable after said period of time at room temperature.

13. A method as recited in claim 12 wherein one of said two components comprises a liquid component at room temperature.

14. A method as recited in claim 9 wherein said hot melt conformal coating composition has a viscosity of less than about 250 cps at said elevated temperature.

15. A method as recited in claim 9 wherein said hot melt conformal coating composition is moisture-curable so as to chemically cross-link and become non-remeltable after said period of time at room temperature.

16. A method as recited in claim 9 wherein said depositing step comprises a nonpattern-specific spray deposition process.

17. A method as recited in claim 9 wherein said depositing step comprises an extrusion process.

18. A method as recited in claim 9 wherein said depositing step comprises an extrusion process in which an extrusion application head contacts said portion.

19. A method as recited in claim 9 wherein said depositing step comprises an brushing process.

20. A method as recited in claim 9 wherein said depositing step comprises a flowing heated wave process.

* * * * *